United States Patent [19]

Thomson

[11] 4,110,608

[45] Aug. 29, 1978

[54] TWO-TERMINAL PHOTODETECTORS WITH INHERENT AC AMPLIFICATION PROPERTIES

[75] Inventor: Elihu Craig Thomson, Wellesley, Mass.

[73] Assignee: Electronics Corporation of America, Cambridge, Mass.

[21] Appl. No.: 738,950

[22] Filed: Nov. 4, 1976

[51] Int. Cl.² .............................................. H01J 39/12
[52] U.S. Cl. ................................. 250/214 A; 307/311
[58] Field of Search ........... 250/214 R, 214 A, 214 B; 307/311

[56] References Cited

U.S. PATENT DOCUMENTS 3,619,629   11/1971   Matthews ........................... 250/221

Primary Examiner—David C. Nelms
Assistant Examiner—Darwin R. Hostetter
Attorney, Agent, or Firm—Charles E. Pfund

[57] ABSTRACT

A two-terminal photodetector comprising a photodiode and a plurality of active and passive components connected so that when connected to a source of current the voltage across the terminals is proportional to the illumination and is proportional by an amplification factor to rapidly changing illumination levels.

12 Claims, 5 Drawing Figures

TWO-TERMINAL PHOTODETECTORS WITH INHERENT AC AMPLIFICATION PROPERTIES

BACKGROUND OF THE INVENTION

There is a growing need for photodetectors which respond to rapidly-changing illumination but ignore relatively large amounts of steady or slowly-changing illumination. This need has been brought about by the development of the light-emitting diode (LED) which, unlike incandescent lamps, can be made to change light output substantially instantaneously in response to rapidly-changing currents but are capable of very little continuous light output. Advantage has been taken of these properties in photodetection systems to modulate the LED current at a high rate and pick up the modulation with a sensitive detector which does not respond to steady sources, or to "pulse" the LED with high-current, short duration pulses, repeated infrequently so as to maintain low average power. In such systems there is need for a photodetector that produces a high signal output to rapidly-changing illumination and as much as possible ignores slowly-changing and steady illumination, while at the same time acting as a two terminal device so that wiring to a sensor of this type can be just as simple as to more elementary sensors such as phototransistors and photoresistors. In the prior art such elementary sensors can be used to convert the illumination into its electrical analog but require the later separation and relative amplification of the modulation component. This prior arrangement is disadvantageous because the amplifier is generally remote from the signal source and is subjected at its input to all the noise picked up on the signal lead. In addition, the unamplified signal at the sensor will be usually at a high impedance level so that cable losses become severe, particularly for high modulation frequencies or pulsed operation.

BRIEF SUMMARY OF THE INVENTION

The object of the present invention is to provide a two-terminal photodetector that selectively amplifies high frequencies, such as are constituted by short-duration pulses, at the source and furnishes a high level modulation signal at a relatively low impedance suitable for transmission without significant loss over long runs of cable to supply the desired signal at a location remote from the sensor. To achieve this objective the invention provides a photodiode operating into a current-to-voltage converter which is coupled to an output amplifier such that any rapidly-changing signal component is amplified relative to the steady state illumination signal level and delivered to the terminals of the device at relatively low impedance.

DETAILED DESCRIPTION OF THE PREFERRED EMBODIMENTS

Figure 1:
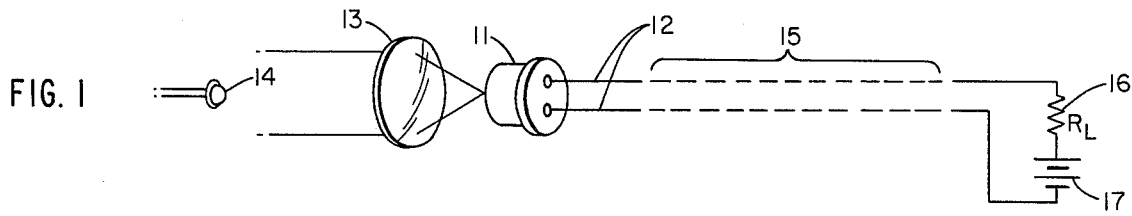
FIG. 1 is a perspective view of a typical physical arrangement of the invention and the circuit in which it is utilized.

Referring to FIG. 1, a typical arrangement in which a photodetector device 11 is used is shown. Generally, the photodetector device 11 is encased in a suitable hermetically sealed envelope with a transparent window for admission of incident radiation to be detected. As indicated in FIG. 1, the device 11 is a two-terminal device having a pair of leads 12 as the only electrical connection to the interior of the device 11. Such devices are used in a multitude of diverse arrangements and as typical of only one such application, FIG. 1 shows the device 11 disposed relative to an optical system represented by lens 13 to receive radiation from a particular source indicated as LED (light emitting diode) 14. In the present invention it is postulated that the light energy incident on the photo sensor device within element 11 is modulated or occurs in pulses such that it has high frequency components derived either from modulation of the light source 14 or the action of interrupting the light path between the source 14 and the photodetector 11 such as by the passage of light interrupting materials or objects between the source 14 and the detector 11. Other arrangements using reflected light to read a bar code or similar applications which involve light modulation incident upon the detector 11 are all included within the applications which can use the present invention to advantage.

Generally, applications of the type shown in FIG. 1, have the terminals 12 of the photodetector 11 connected by means of a cable 15 to a load 16 and the system is energized from a DC source 17. The DC potential of source 17 is thus connected serially through the load resistor 16 to the two terminals 12 of the photodetector device 11. In accordance with the invention, the length of the cable 15 may be long due to the low impedance and high signal level provided at terminals 12 in accordance with the invention as will presently be described.

Figure 2:
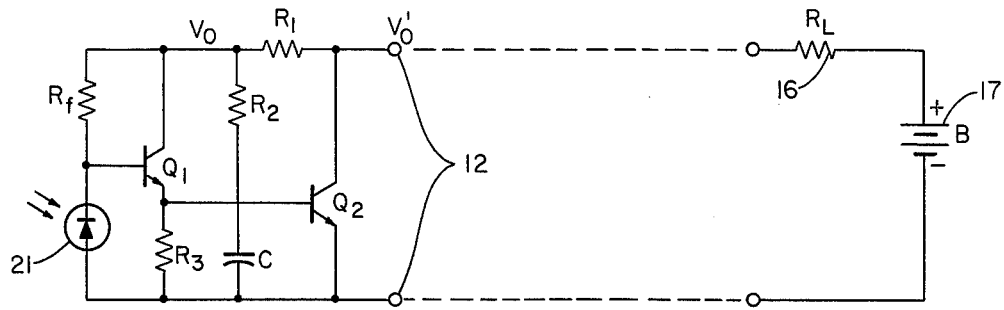
FIG. 2 is a schematic wiring diagram corresponding to the arrangement shown in FIG. 1 and showing the details of the two-terminal photodetector.

Referring now to FIG. 2, the circuit arrangement of the invention will be described. A sensor of radiant energy such as photodiode 21 is connected reverse-biased between the base and emitter of a transistor Q1 and a feedback resistor Rf is connected between the collector and base. This arrangement provides a simple one-transistor current-to-voltage converter for the photodiode 21. When this configuration is connected as described in FIG. 1 to a source of current such as battery 17 in series with a resistor such as load resistor 16 of value RL, base current will flow in Q1 if RL is smaller than Rf and the collector of Q1 will carry current and drop in voltage until the current in Rf is reduced to only that value which enables the conductivity in Q1 to sustain that value. Normally, Q1 will be nearly saturated. Now any illumination on photodiode 21 will change the photocurrent therein and will thus divert current from the base of Q1 and cause the collector of Q1 to rise to a new value, the difference being equal to the current in photodiode 16 times the resistance of Rf. Thus, the voltage Vo on the collector Q1 is the analog of the current in photodiode 21.

The remaining circuit of the invention comprises an emitter resistor R3 for transistor Q1, a resistor capacitor voltage divider having resistor R1 connected between one terminal and a terminal of feedback resistor Rf and a resistor R2 and capacitor C connected across the transistor Q1 and its emitter resistor R3. Across the output terminals 12 is connected an output transistor Q2 which has its base connected to the emitter of transistor Q1. The output transistor Q2 thus supplies signals to the terminals 12 and is driven from the emitter of transistor Q1 with the amplification controlled by the operation of the voltage divider R1, R2 and C which is selective with respect to frequency as hereinafter described.

The operation of the circuit of FIG. 2 will now be described. The resistor R3 between base and emitter of transistor Q2 requires that a minimum current flow in transistor Q1 to overcome the base-emitter gap voltage of transistor Q2 thus forcing transistor Q1 to operate at a predetermined value of collector-emitter current. The output voltage $V'o$ in response to steady illumination merely repeats the voltage value $Vo$ with a small constant additional value which can be explained as follows. With no illumination the feedback resistor $Rf$ will cause transistor Q1 to draw enough collector current to energize the base of transistor Q2 after which transistor Q2 will draw collector current until the voltage $Vo$ is such that the voltage across resistor $Rf$ is self-sustaining at a low value. The base current in transistor Q2 is much smaller than the current in resistor R3 and the values of both resistors R3 and R1 are made smaller than the value of resistor $Rf$. For R1=R3, under these conditions, the voltage drop in resistor R1 will mirror the voltage drop in resistor R3 (about 0.6 volts) so that $V'o$ is proportional to the current in photodiode 21 plus a fixed 0.6 volts. This is true only when no current is flowing in resistor R2, that is, for steady or slowly-changing illumination when there is no charging current in capacitor C.

Now if there is a sudden increase in illumination on photodiode 21, some base current will be diverted from transistor Q1 which will result in a loss of some base current in transistor Q2 and its collector voltage will rise. Now for such rapidly changing signal the voltage $Vo$ will rise only as permitted by the voltage-divider R1/R2 because the voltage on C cannot change instantaneously. The output voltage $V'o$ will rise until voltage $Vo$ is sufficient to satisfy the new current requirement of the photodiode 21, but with $V'o$ constrained to be equal to $Vo$ multiplied by the ratio $(R1+R2)/R2$. Thus for frequencies for which C represents a low impedance, transistor Q2 operates as an amplifier whose gain is $(R1+R2)/R2$ while at low frequencies and DC its gain is unity.

Since transistors Q1 and Q2 comprise a feedback-controlled amplifier the output impedance is low, which means that $V'o$ resists any external attempt to change it. For example, if the load resistor 16 were lowered, the voltages $V'o$ and $Vo$ would attempt to rise, resulting in more base current in transistor Q1 and collector current in transistor Q2. Thus feedback in conjunction with the high current gain of transistors Q1 and Q2 causes relative stability of the output voltage $V'o$ to changing load currents.

Figure 3:
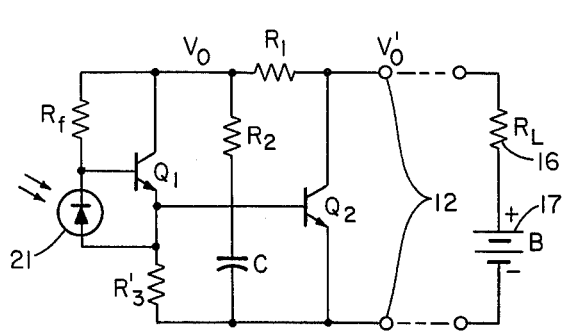
FIG. 3 is a schematic wiring diagram of a modification which has faster response time than the arrangement shown in FIG. 2.

A modified version of the invention is shown in FIG. 3. In this version the photodiode 21 is connected directly between the base and emitter of transistor Q1. In this circuit the photodiode current must flow through the resistor $R'_3$ so it has a lower resistance relative to the value of $R_3$ in FIG. 2. The advantage of the circuit is that the response of photodiode 21 is faster because it experiences no degenerative feedback from the emitter-base junction of the second transistor Q2.

Figure 4:
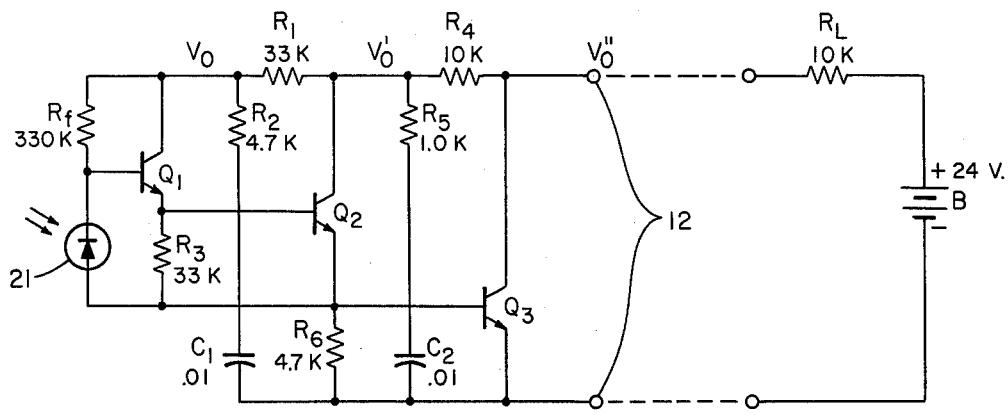
FIG. 4 is a schematic wiring diagram of a modification employing additional selective AC amplification.

FIG. 4 shows an extension of the amplification principle to include two stages. For each stage of amplification a separate resistance capacitance voltage divider is provided. Thus for transistor Q2 the resistors R1, R2 and C1 are connected as described for the circuit of FIG. 2. For transistor Q3 the resistors R4, R5 and C2 are connected across the output terminals 12 with resistor R5 and capacitor C2 connected across transistor Q2 and its emitter resistor $R'6$ thereby achieving still higher gain while retaining two terminals. As shown, the circuit of FIG. 4 combines features of the circuits of both FIGS. 2 and 3. For DC currents, transistors Q1 and Q2 act in the same manner as in FIG. 2. In the quiescent-state the currents from the transistors Q1, Q2 and the photodiode 21 are passed into a resistor R6 and the base of a transistor Q3 when the base-emitter voltage gap of Q3 is overcome. The transistor Q3, accordingly, will conduct until the voltage drop across resistor $Rf$ has been reduced to a level which just supports the current required in transistor Q3 to sustain its conductivity. Thus the FIG. 4 output voltage $V''o$ will be a product of the current in photodiode 21 and resistance value of $Rf$ plus a small fixed drop in resistor R3 to support the bias current in R3 and another small fixed voltage in to help support the bias current in R6.

Now if, in the circuit of FIG. 4, there is a sudden increase in illumination to the photodiode 21, base current will be diverted from transistor Q1 and consequently reduced in transistors Q2 and Q3. The output voltage $V''o$ will quickly rise to a value which will cause voltage $Vo$ to satisfy the increased current demand. However, because of the dynamic voltage divider effect of R1, R2, R4, R5, the output voltage $V''o$ is constrained to be a substantial multiple of $Vo$. In fact, if R4 is much larger than R5 and R1 much larger than R2 and R5 (which would normally be the case) then the output voltage $V''o \simeq R1/R2 \times R4/R5 \; Vo$ (approximately). Thus AC signal components are increased by two stage amplification while the DC illumination level varies the output voltage with only unity gain. Typical values for the parameters are given for the FIG. 4 circuit.

Figure 5:
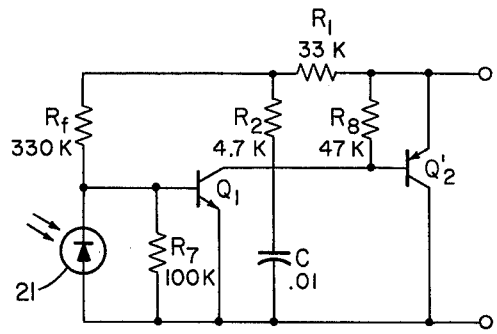
FIG. 5 is a schematic wiring diagram of a modification employing opposite conductivity type transistors.

FIG. 5 shows a different arrangement of a load-type amplifier driven by the basic current-to-voltage converter. This version differs mainly from the previously described embodiments in that transistor Q'2 is a PNP conductivity type, driven from the collector of NPN type transistor Q1, rather than as in the previous versions an NPN transistor driven from the emitter of transistor Q1. A 100K resistor R7 is added for the purpose of drawing an initial (dark) current to keep the collector of transistor Q1 from operating at an undesirably low voltage. The disadvantage of the circuit of FIG. 5 is that transistor Q2 is essentially an emitter follower, that is, its emitter follows the collector of Q1 so that the collector-emitter voltage swing is the same as the output voltage. For this connection the effect of collector-base capacitance is substantially increased by the Miller effect and the device has slower response times than other versions.

The various arrangements of the circuits disclosed can all be accommodated within the envelope of the photodetector device 11 and the device is then directly substitutable for conventional photo sensors having only two terminals. Various modifications of the disclosed circuits will occur to those skilled in the art and the invention, accordingly, should not be considered as limited to the illustrated embodiments but only by the scope of the appended claims.

I claim:

1. A two terminal photoresponsive device comprising:
    a pair of terminals;
    an output transistor having its collector-emitter path connected across said terminals;
    a voltage divider incuding two resistors and a capacitor in series connected across said terminals;
    photosensing means having a device responsive to incident radiation and including current to voltage conversion means for producing a voltage signal in accordance with incident radiation; and
    circuit means interconnecting said conversion means and said voltage divider to drive said output transistor for amplifying the time varying components of said voltage signal relative to the average value thereof as applied by said output transistor to a load connected to said terminals.

2. The device according to claim 1 wherein said photosensing means includes a photodiode responsive to radiation to produce a current analog of the incident radiation level.

3. The device according to claim 2 including a second transistor and wherein said photodiode is connected in series with a feedback resistor across the collector-emitter path of said second transistor, the base of said second transistor connected to the connection between said series connected photodiode and feedback resistor.

4. The device according to claim 3 wherein the parallel combination of said second transistor and said series connected photodiode and feedback resistor is connected across the series combination of said capacitor and one of said resistors in said voltage divider.

5. Apparatus according to claim 4 wherein said output transistor has its base connected to the emitter of said second transistor and including a resistor connected between the emitters of said transistors.

6. Apparatus according to claim 5 wherein said series connected photodiode and feedback resistor are directly connected across said collector-emitter path of said second transistor.

7. Apparatus according to claim 5 wherein said series connected photodiode and feedback resistor are connected across the collector-emitter path of said second transistor through said resistor connected between the emitters of said transistors.

8. Apparatus according to claim 4 further including a second voltage divider having two resistors and a capacitor connected in series across said terminals, a third transistor having its collector-emitter path connected through a resistor across the series combination of said capacitor and one of said resistors in said second voltage divider, and circuit means wherein said second transistor drives said third transistor and said third transistor drives said output transistor.

9. Apparatus according to claim 1 and including a source of potential and a conductive load impedance serially connected to said terminals.

10. A two terminal photoresponsive device comprising:
    a pair of terminals;
    a voltage divider including a pair of resistors and a capacitor connected in series across said terminals;
    a photodiode and a feedback resistor connected in series across the series combination of said capacitor and one of said resistors in said voltage divider;
    a transistor;
    a series circuit including the collector-emitter path of said transistor and an emitter resistor connected to the emitter, said series circuit connected across said series combination;
    a circuit connecting said photodiode across the base-emitter path of said transistor;
    an output transistor having its collector-emitter path connected across said terminals; and
    a circuit connecting said emitter resistor across the base-emitter path of said output transistor.

11. An enhanced AC response two terminal photodetector comprising:
    a pair of terminals;
    a photodiode;
    a current to voltage converter circuit including a first transistor driven by said photodiode;
    an output transistor connected to supply signal output to said terminals; and
    AC decoupling circuit means including said first and output transistors operable for amplifying AC signals from said photodiode to said output terminals while passing non-time-variant photodiode signals to said output with approximately unity gain.

12. A two terminal photoresponsive device comprising:
    a pair of terminals;
    an output transistor having its collector-emitter path connected to said terminals;
    a first voltage divider having two resistors and a capacitor serially connected across said terminals;
    a first transistor having its collector-emitter path and an emitter resistor connected across the capacitor and one of the resistors of said first voltage divider;
    a connection between the base of said output transistor and the emitter of said first transistor;
    a second voltage divider having two resistors and a capacitor serially connected in circuit parallel with said collector-emitter path of said first transistor;
    a second transistor having its collector-emitter path and an emitter resistor connected across the capacitor and one of the resistors of said second voltage divider;
    a connection between the base of said first transistor and the emitter of said second transistor;
    a photodiode and a resistor serially connected across the collector-emitter path of said second transistor; and
    a connection for applying current signals of said photodiode to the base of said second transistor.

* * * * *